US010050413B2

(12) United States Patent
Chiu et al.

(10) Patent No.: US 10,050,413 B2
(45) Date of Patent: Aug. 14, 2018

(54) SEMICONDUCTOR LASER APPARATUS

(71) Applicant: LandMark Optoelectronics Corporation, Tainan (TW)

(72) Inventors: Shu-Wei Chiu, Tainan (TW); Yin-Jie Ma, Tainan (TW); Wei Lin, Tainan (TW)

(73) Assignee: Landmark Optoelectronics Corporation, Tainan Science-Based Industrial Park (TW)

( * ) Notice: Subject to any disclaimer, the term of this patent is extended or adjusted under 35 U.S.C. 154(b) by 0 days.

(21) Appl. No.: 15/708,531

(22) Filed: Sep. 19, 2017

(65) Prior Publication Data

US 2018/0166857 A1    Jun. 14, 2018

Related U.S. Application Data

(60) Provisional application No. 62/432,814, filed on Dec. 12, 2016.

(51) Int. Cl.
*H01S 5/16* (2006.01)
*H01S 5/32* (2006.01)
*H01S 5/22* (2006.01)
*H01S 5/20* (2006.01)

(52) U.S. Cl.
CPC ............ *H01S 5/3211* (2013.01); *H01S 5/164* (2013.01); *H01S 5/2031* (2013.01); *H01S 5/222* (2013.01)

(58) Field of Classification Search
CPC ....... H01S 5/164; H01S 5/1014; H01S 5/1003
See application file for complete search history.

(56) References Cited

U.S. PATENT DOCUMENTS 5,987,046 A * 11/1999 Kobayashi ......... G02B 6/12004
372/45.01
6,717,971 B2 * 4/2004 Marsh ....................... H01S 5/22
372/50.1

* cited by examiner

*Primary Examiner* — Michael Carter
(74) *Attorney, Agent, or Firm* — Muncy, Geissler, Olds & Lowe, P.C.

(57) ABSTRACT

A semiconductor laser apparatus is provided and has a substrate, a first type cladding layer, a first type waveguide layer, an active layer, a second type waveguide layer, a second type cladding layer, and a capping layer disposed in sequence. The active layer has a light producing portion and a light emitting portion. A laser produced by the light producing portion, emits along a direction from the light producing portion toward the light emitting portion. The light emitting portion includes a first inactive region, a light emitting region, and a second inactive region. A refractive index of the light emitting region is lower than a refractive index of the first inactive region, the refractive index of the light emitting region is lower than a refractive index of the second inactive region, and width of a first part of the light emitting region continuously increases along the direction.

10 Claims, 11 Drawing Sheets

SEMICONDUCTOR LASER APPARATUS

CROSS REFERENCE TO RELATED APPLICATION

This application claims priority to U.S. Provisional Application No. 62/432,814, filed Dec. 12, 2016, titled "SEMICONDOCTOR LASER APPARATUS WITH NARROW BEAM DIVERGENCE ANGLE AND METHOD OF FABRICATING THE SAME", which is incorporated herein by reference in its entirety.

FIELD OF THE DISCLOSURE

The present disclosure relates to a laser apparatus, and more particularly to a semiconductor laser apparatus.

BACKGROUND OF THE DISCLOSURE

Conventional semiconductor lasers are mainly used in optical communication technology, cancer treating technology, optical pumps of solid laser technology, and material processing technology. For these applications, the semiconductor lasers are particularly suitable for mass manufacturing due to their small size, large power, being driven by electricity, and inexpensive nature.

However, the conventional semiconductor lasers still have room for improvement. Therefore, it is necessary to provide a semiconductor laser apparatus.

SUMMARY OF THE DISCLOSURE

An objective of the present disclosure is to provide a semiconductor laser apparatus, where an emitted laser beam of the semiconductor laser apparatus, in comparison of an emitted laser beam of a conventional semiconductor laser apparatus, has a relatively small far-field vertical beam divergence angle and a relatively small far-field lateral beam divergence angle by an active layer with a special refractive index distribution, such that the semiconductor laser apparatus of one embodiment of the present disclosure may have a relatively good coupling efficiency when coupled with an optical fiber.

Another objective of the present disclosure is to provide a semiconductor laser apparatus, the semiconductor laser apparatus of one embodiment of the present disclosure does not substantially affect light output efficiency, while improving the far-field vertical beam divergence angle and the far-field lateral beam divergence angle.

To achieve the above objective, the present disclosure provides a semiconductor laser apparatus including: a substrate, a first type cladding layer, a first type waveguide layer, an active layer, a second type waveguide layer, a second type cladding layer, and a capping layer. The first type cladding layer is disposed on the substrate. The first type waveguide layer is disposed on the first type cladding layer. The active layer is disposed on the first type waveguide layer and includes a light producing portion and a light emitting portion, where a laser produced by the light producing portion, emits along a direction from the light producing portion toward the light emitting portion. The light emitting portion includes a first inactive region, a light emitting region, and a second inactive region, where a refractive index of the light emitting region is lower than a refractive index of the first inactive region, the refractive index of the light emitting region is lower than a refractive index of the second inactive region, and width of a first part of the light emitting region continuously increases along the direction from the light producing portion toward the light emitting portion. The second type waveguide layer is disposed on the active layer. The second type cladding layer is disposed on the second type waveguide layer. The capping layer is disposed on the second type cladding layer.

In one embodiment of the present disclosure, the first type cladding layer is an n-type cladding layer; the first type waveguide layer is an n-type waveguide layer; the second type waveguide layer is a p-type waveguide layer; and the second type cladding layer is a p-type cladding layer.

In one embodiment of the present disclosure, the first type cladding layer is a p-type cladding layer; the first type waveguide layer is a p-type waveguide layer; the second type waveguide layer is an n-type waveguide layer; and the second type cladding layer is an n-type cladding layer.

In one embodiment of the present disclosure, a second part of the light emitting region has a constant widthalong the direction from the light producing portion toward the light emitting portion.

In one embodiment of the present disclosure, the semiconductor laser apparatus further includes a first boundary located between the first inactive region and the light emitting region; and a second boundary located between the light emitting region and the second inactive region, wherein the width of the first part of the light emitting region is defined by a distance between the first boundary and the second boundary.

In one embodiment of the present disclosure, the first boundary is linear or parabolic in shape.

In one embodiment of the present disclosure, the second boundary is linear or parabolic in shape.

In one embodiment of the present disclosure, the light producing portion comprises: a first inactive light producing region; a second inactive light producing region; and a light producing region disposed between the first inactive light producing region and the second inactive light producing region, wherein a refractive index of the light producing region is greater than a refractive index of the first inactive light producing region, and the refractive index of the light producing region is greater than a refractive index of the second inactive light producing region.

In one embodiment of the present disclosure, the semiconductor laser apparatus further includes a first border located between the first inactive light producing region and the first inactive region; and a first boundary located between the first inactive region and the light emitting region, wherein a first angle, ranging from 0.1 degrees to 89.9 degrees, is located between the first boundary and the first border.

In one embodiment of the present disclosure, the semiconductor laser apparatus further includes a second border located between the second inactive light producing region and the second inactive region; and a second boundary located between the second inactive region and the light emitting region, wherein a second angle ranging, from 0.1 degrees to 89.9 degrees, is located between the second boundary and the second border.

DETAILED DESCRIPTION OF THE PREFERRED EMBODIMENTS

The structure and the technical means adopted by the present disclosure to achieve the above and other objects can be best understood by referring to the following detailed description of the preferred embodiments and the accompanying drawings. Furthermore, directional terms described by the present disclosure, such as upper, lower, front, back, left, right, inner, outer, side, periphery, center, horizontal, transverse, vertical, longitudinal, axial, radial, top layer or bottom layer, etc., are only directions by referring to the accompanying drawings, and thus the used directional terms are used to describe and understand the present disclosure, but the present disclosure is not limited thereto.

Figure 1A:
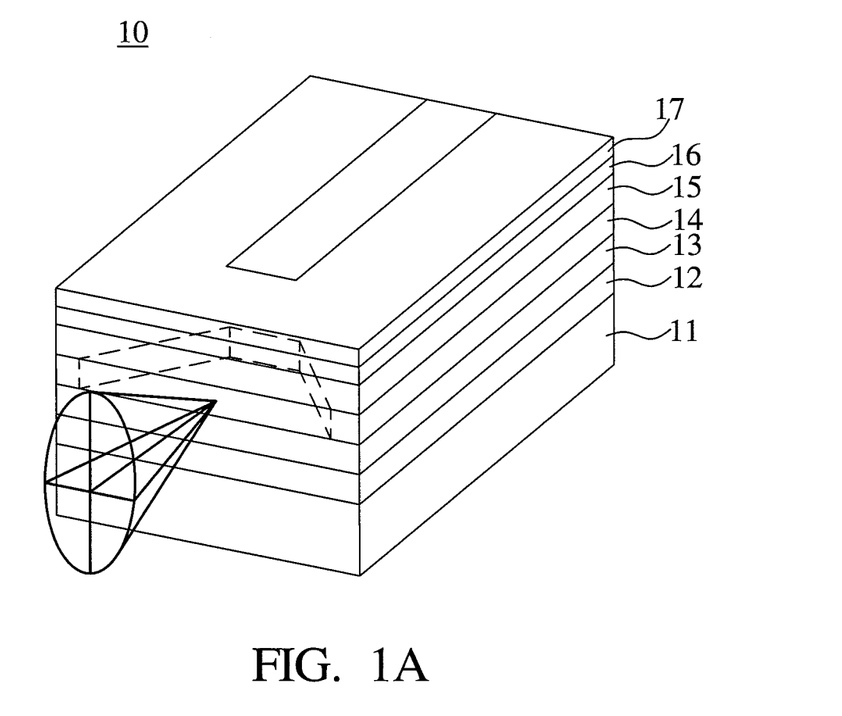
FIG. 1A is a three-dimensional diagram of a semiconductor laser apparatus of one embodiment of the present disclosure.
Figure 1B:
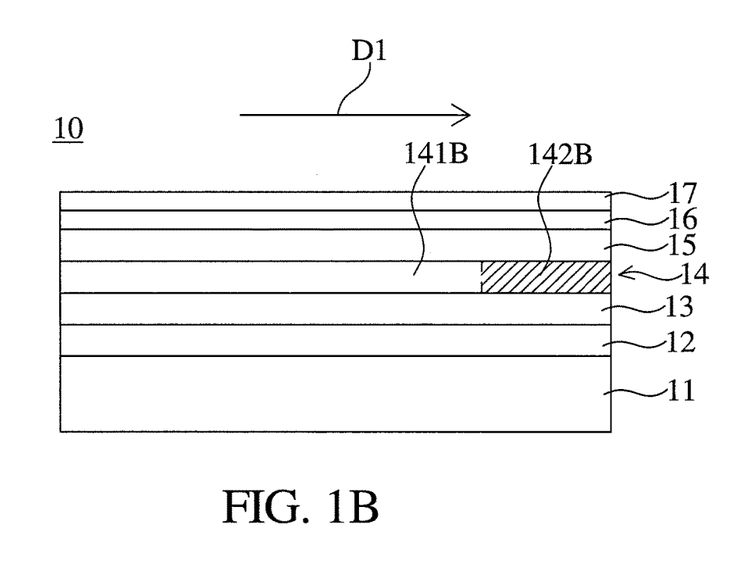
FIG. 1B is a cross-sectional diagram of a semiconductor laser apparatus of one embodiment of the present disclosure.

Please refer to FIG. 1A together with FIG. 1B. FIG. 1A is a three-dimensional diagram of a semiconductor laser apparatus 10 of one embodiment of the present disclosure; FIG. 1B is a cross-sectional diagram of a semiconductor laser apparatus 10 of one embodiment of the present disclosure. In one embodiment of the present disclosure, the semiconductor laser apparatus 10 includes a substrate 11, a first type cladding layer 12, a first type waveguide layer 13, an active layer 14, a second type waveguide layer 15, a second type cladding layer 16, and a capping layer 17, where the first type cladding layer 12, the first type waveguide layer 13, the active layer 14, the second type waveguide layer 15, the second type cladding layer 16, and the capping layer 17 are disposed sequentially on the substrate 11 so as to form the semiconductor laser apparatus 10. For example, the first type cladding layer 12 is disposed on the substrate 11; the first type waveguide layer 13 is disposed on the first type cladding layer 12; the active layer 14 is disposed on the first type waveguide layer 13; the second type waveguide layer 15 is disposed on the active layer 14; the second type cladding layer 16 is disposed on the second type waveguide layer 15; and the capping layer 17 is disposed on the second type cladding layer 16.

In one embodiment, the first type cladding layer 12 can be an n-type cladding layer; the first type waveguide layer 13 can be an n-type waveguide layer; the second type waveguide layer 15 can be a p-type waveguide layer; and the second type cladding layer 16 can be a p-type cladding layer. In another embodiment, the first type cladding layer 12 can be a p-type cladding layer; the first type waveguide layer 13 can be a p-type waveguide layer; the second type waveguide layer 15 can be an n-type waveguide layer; and the second type cladding layer 16 can be an n-type cladding layer.

In one embodiment, the substrate 11 can be formed of GaAs or InP. In another embodiment, the n-type cladding layer can be formed of AlGaAs, InP, or AlGaInP. The n-type cladding layer can have a thickness ranging from 100 nm to 5000 nm. In a yet another embodiment, the n-type waveguide layer can be formed of GaAs, GaInP, InAlAs, or InGaAsP. The n-type waveguide layer can have a thickness ranging from 10 nm to 2000 nm. In another embodiment, the p-type cladding layer can be formed of AlGaAs, InP, or AlGaInP. The p-type cladding layer can have a thickness ranging from 100 nm to 5000 nm. In a yet another embodiment, the p-type waveguide layer can be formed of GaAs, GaInP, InAlAs, or InGaAsP. The p-type waveguide layer can have a thickness ranging from 10 nm to 2000 nm. In a yet another embodiment, the active layer 14 can be formed of InGaAs, InAlGaAs, GaAs, or GaAsP.

Figure 2A:
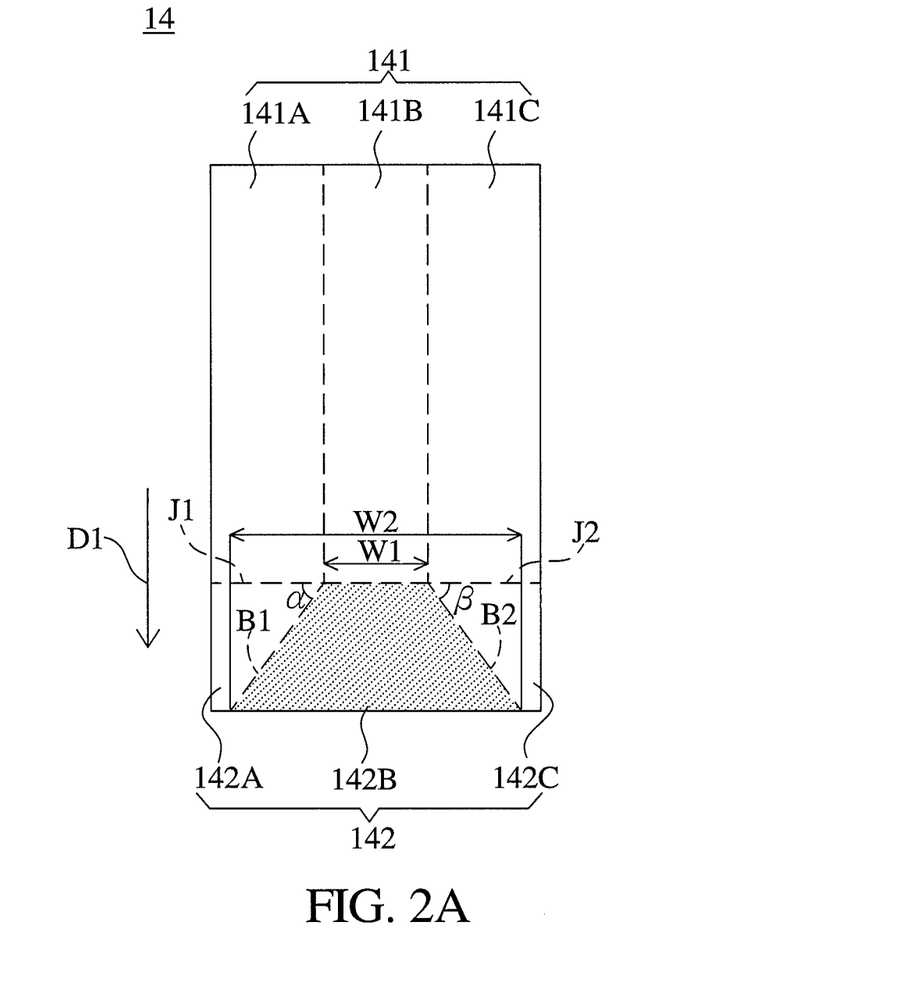
FIG. 2A is a top view of an active layer of a semiconductor laser apparatus of one embodiment of the present disclosure.
Figure 2B:
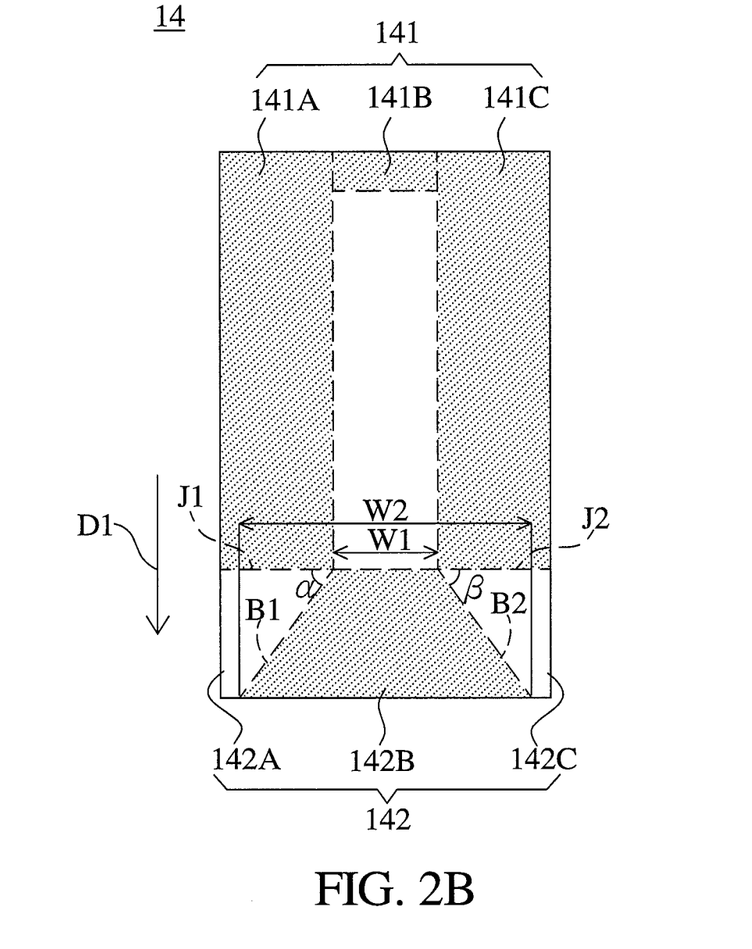
FIG. 2B is a top view of an active layer of a semiconductor laser apparatus of another embodiment of the present disclosure.
Figure 2C:
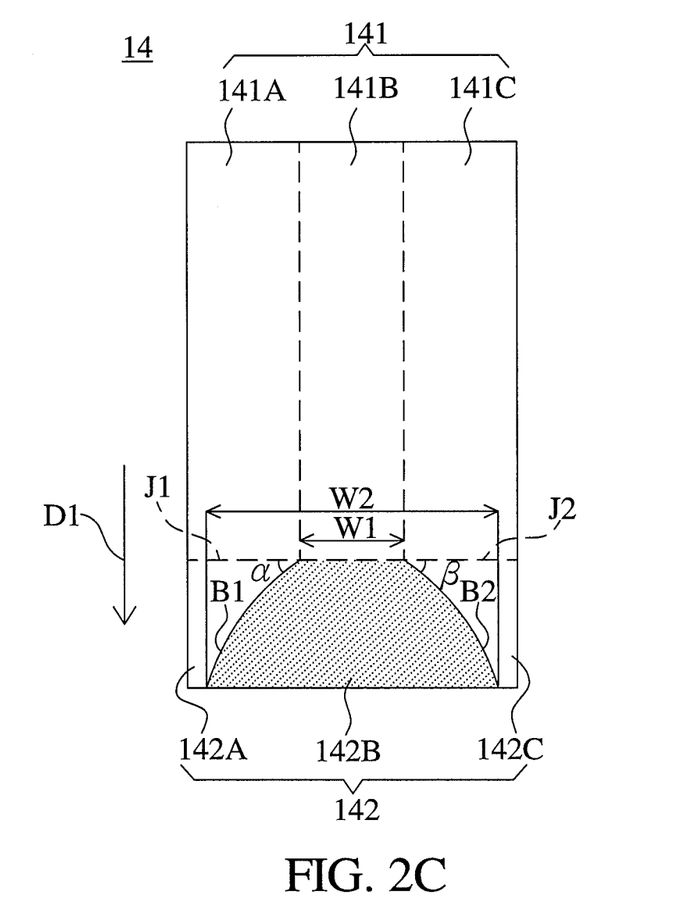
FIG. 2C is a top view of an active layer of a semiconductor laser apparatus of a yet another embodiment of the present disclosure.
Figure 2D:
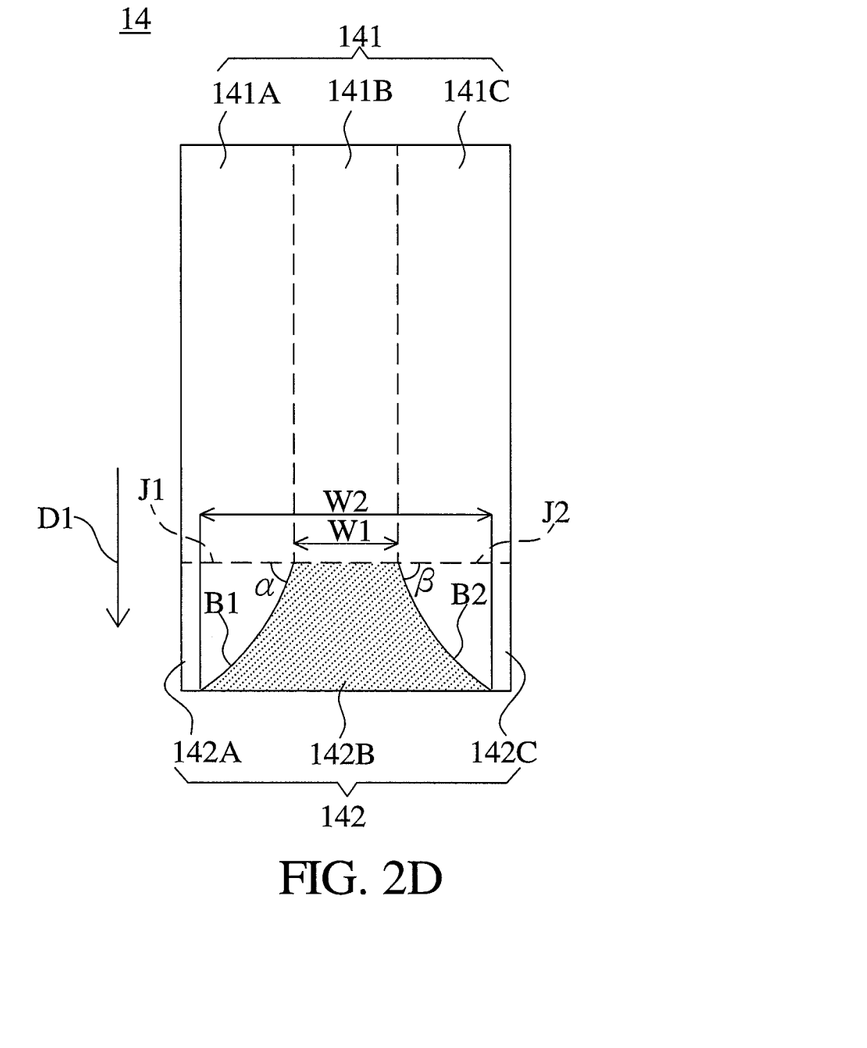
FIG. 2D is a top view of an active layer of a semiconductor laser apparatus of a further embodiment of the present disclosure.
Figure 2E:
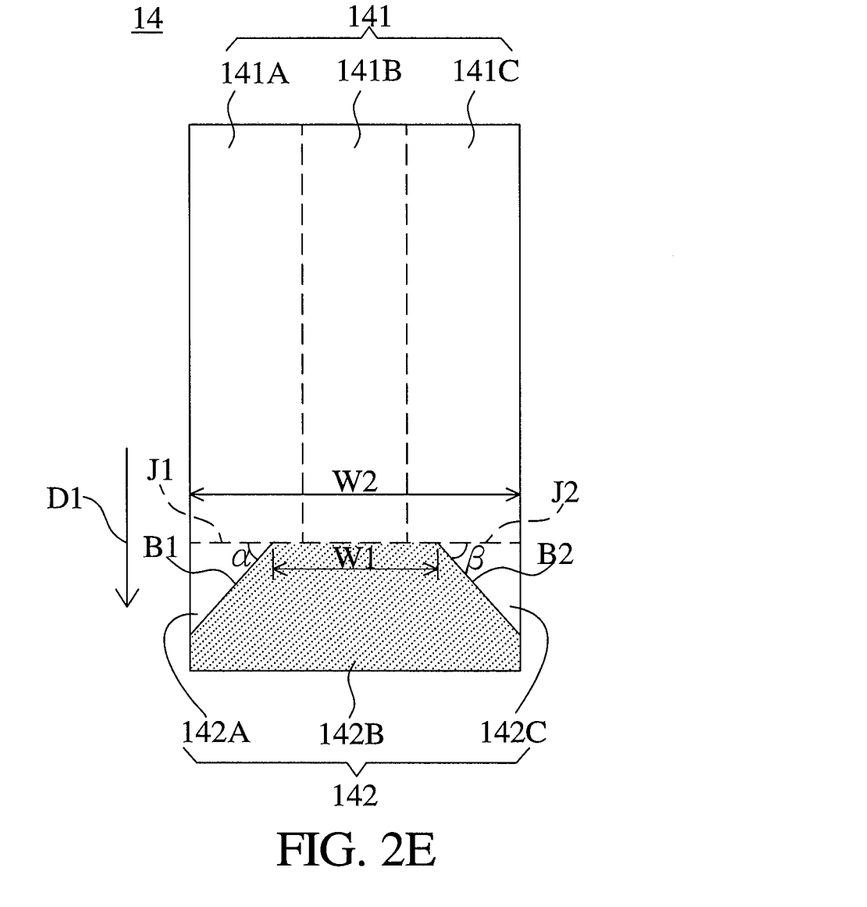
FIG. 2E is a top view of an active layer of a semiconductor laser apparatus of a yet another embodiment of the present disclosure.

In one embodiment of the present disclosure, a far-field vertical beam divergence angle and a far-field lateral beam divergence angle of the semiconductor laser apparatus 10 can be reduced by the active layer 14 with a special refractive index region. Please refer to FIG. 1A to FIG. 2E together. FIG. 2A is a top view of an active layer 14 of a semiconductor laser apparatus 10 of one embodiment of the present disclosure; FIG. 2B is a top view of an active layer 14 of a semiconductor laser apparatus 10 of another embodiment of the present disclosure; FIG. 2C is a top view of an active layer 14 of a semiconductor laser apparatus 10 of a yet another embodiment of the present disclosure; FIG. 2D is a top view of an active layer 14 of a semiconductor laser apparatus 10 of a further embodiment of the present disclosure; and FIG. 2E is a top view of an active layer 14 of a semiconductor laser apparatus 10 of a yet another embodiment of the present disclosure. The active layer 14 includes a light producing portion 141 and a light emitting portion 142, where a laser beam produced by the light producing portion 141 of the active layer 14, emits substantially along a direction D1 from the light producing portion 141 toward the light emitting portion 142. The light producing portion 141 can be divided into a first inactive light producing region 141A, a light producing region 141B, and a second inactive light producing region 141C respectively, where the light producing region 141B is disposed between the first inactive light producing region 141A and the second inactive light producing region 141O. In one embodiment, each of the first inactive light producing region 141A, the light producing region 141B, and the second inactive light producing region 141C has a high refractive index (as shown in FIG. 2A). In another embodiment, the light producing region 141B has a high refractive index, and each of the first inactive light producing region 141A and the second inactive light producing region 141C has a low refractive index. In a specific example, the light producing region 141B includes a high refractive index region and a low refractive index region neighboring each other, where the low refractive index region, with respect to the high refractive index region, is away from the light emitting portion 142 (as shown in FIG. 2B).

In one embodiment, the light emitting portion 142 of the active layer 14 includes a first inactive region 142A, a light emitting region 142B, and a second inactive region 142C, where the light emitting region 142B is disposed between the first inactive region 142A and the second inactive region 142C. In one embodiment, the first inactive region 142A and the first inactive light producing region 141A are adjacent to and connected with each other; the light emitting region 142B and the light producing region 141B are adjacent to and connected with each other; and the second inactive region 142C and the second inactive light producing region 141C are adjacent to and connected with each other. In one embodiment, each of the first inactive region 142A and the second inactive region 142C has a high refractive index, and the light emitting region 142B has a low refractive index, where the light emitting region 142B expands substantially along a direction D1 from the light producing portion 141 towards the light emitting portion 142. For example, width of the light emitting region 142B will continuously increase in a direction from a connection of the light emitting region 142B and the light producing region 141B toward the light emitting region 142B (e.g., from width W1 to width W2), such that the light emitting region 142B is substantially trapezoidal in shape.

In a specific example, the width of the light emitting region 142B can be defined by the first inactive region 142A and the second inactive region 142C. For example, a first boundary B1 is located between the first inactive region 142A and the light emitting region 142B; and a second boundary B2 is located between the light emitting region 142B and the second inactive region, where the width of the first part of the light emitting region 142B is defined by a distance between the first boundary B1 and the second boundary B2. In one embodiment, the first boundary B1 and the second boundary B2 can be linear in shape (as shown in FIGS. 2A, 2B, and 2E) or parabolic in shape (as shown in FIGS. 2C and 2D). It is noted that the first boundary B1 and the second boundary B2 must increase the width of the light emitting region 142B continuously (e.g., FIGS. 2A to 2D) or in a state which the width is at least partially not reduced (e.g., FIG. 2E). From the above, the width of the entire light emitting region 142B can be increased continuously along the direction D1 (e.g., in FIGS. 2A to 2D, the first part can be indicated as the entire light emitting region 142B); or the width of a first part of the light emitting region 142B can be increased continuously along the direction D1, and a second part (not shown) of the light emitting region 142B can has a constant width along the direction D1 (e.g., in FIG. 2E, the first part can include an upper region of the light emitting region 142B (with an increasing width), and the second part can include an lower region of the light emitting region 142B (with an constant width)).

In one embodiment, a first border J1 is located between the first inactive light producing region 141A and the first inactive region 142A, and a first angle α is located between the first border J1 and the first boundary B1, where the first angle α ranges from 0.1 degrees to 89.9 degrees. For example, the first angle α can be 1 degree, 2 degrees, 5 degrees, 10 degrees, 15 degrees, 20 degrees, 25 degrees, 30 degrees, 45 degrees, 50 degrees, 60 degrees, 65 degrees, 70 degrees, 75 degrees, 80 degrees, 85 degrees, 88 degrees, 89 degrees, etc. In another embodiment, a second border J2 is located between the second inactive light producing region 141C and the second inactive region 142C, and a second angle β is located between the second border J2 and the second boundary B2, where the second angle β ranges from 0.1 degrees to 89.9 degrees. For example, the second angle β can be 1 degree, 2 degrees, 5 degrees, 10 degrees, 15 degrees, 20 degrees, 25 degrees, 30 degrees, 45 degrees, 50 degrees, 60 degrees, 65 degrees, 70 degrees, 75 degrees, 80 degrees, 85 degrees, 88 degrees, 89 degrees, etc.

In one embodiment, the first boundary B1 can be connected to a boundary between the first inactive light producing region 141A and the light producing region 141B; and the second boundary B2 can be connected to a boundary between the light producing region 141B and the second inactive light producing region 141C (as shown in FIG. 2B). In yet another embodiment, the first boundary B1 can be not connected to a boundary between the first inactive light producing region 141A and the light producing region 141B; and the second boundary B2 can be not connected to a boundary between the light producing region 141B and the second inactive light producing region 141C (as shown in FIG. 2E).

It is noted that the light emitting region 142B having a width with a continuous increase (e.g., from width W1 to width W2) can be used as an anti-waveguide effect region. For example, when a laser beam is produced in the light producing region 141B and moves towards the light emitting region 142B, the formed anti-waveguide structure would expand the laser beam, since the light emitting region 142B has a low refractive index and the first inactive region 142A together with the second inactive region 142C in a periphery are high refractive index regions. Therefore, the laser beam has an increased near-field lateral beam divergence angle and an increased near-field vertical beam divergence angle. Since the near-field lateral beam divergence angle and vertical beam divergence angle have an inverse relationship against the far-filed lateral beam divergence angle and vertical beam divergence angle, the far-filed lateral beam divergence angle and vertical beam divergence angle are reduced accordingly.

It is noted that, generally speaking, in a technical field of semiconductor laser apparatus, the high refractive index and the low refractive index indicated in the active layer 14 show a relative relationship. For example, a material of the active layer 14 has an intrinsic refractive index (i.e., a refractive index of the material of the active layer 14 itself), and the intrinsic refractive index in a part of region of the active layer 14 can increase or decrease by a process treating (e.g., intermixing or diffusion), such that the part of region of the active layer 14 has a refractive index greater than or less than a remaining part of region of the active layer 14. For example, if the refractive index of the part of region of the active layer 14 can be decreased after the process treatment, the treated part of region has a refractive index less than the intrinsic refractive index, and a low refractive index is referred to herein; while the untreated part of region is called a high refractive index (i.e., the intrinsic refractive index). On the contrary, if the refractive index of the part of region of the active layer 14 can be raised after the process treatment, the treated part of region has a refractive index greater than the intrinsic refractive index, and a high refractive index is referred to herein; while the untreated part of region is called a low refractive index (i.e., the intrinsic refractive index). The layer may also be formed by selectively growing or etching a part of a region of the active layer 14 and then growing a material with a required refractive index.

In addition, it is noted that, in one embodiment of the present disclosure, the semiconductor laser apparatus 10 can be fabricated by a conventional process, where the present disclosure is different from the conventional technology in that the active layer 14 of the semiconductor laser apparatus 10 in one embodiment of the present disclosure further has the high refractive index region and the low refractive index region different from those in the conventional technology.

Hereinafter, an embodiment and a comparative example will be proposed to demonstrate that the semiconductor laser apparatus 10 of one embodiment of the present disclosure indeed has an effect of reducing the far-field lateral beam divergence angle and the far-field vertical beam divergence angle.

Embodiment 1

An n-type cladding layer, an n-type waveguide layer, an active layer, a p-type waveguide layer, a p-type cladding layer, and a capping layer are formed sequentially on the substrate, where the active layer includes a light producing portion and a light emitting portion neighboring each other. Each of a first inactive region and a second inactive region of the light emitting portion has a high refractive index, and the light emitting region has a low refractive index, where the light emitting region expands along a direction from the light producing portion toward the light emitting portion, and then the light emitting region is trapezoidal in shape. In the present Embodiment 1, a first angle α of 45 degrees is located between the first border J1 (being located between the first inactive light producing region 141A and the first inactive region 142A) and the first boundary B1; and a second angle β of 45 degrees is located between the second border J2 (being located between the second inactive light producing region 141C and the second inactive region 142C) and the second boundary B2. The present Embodiment 1 can be referred to as shown in FIGS. 1A, 1B, and 2A.

Comparative Example 1

Figure 3:
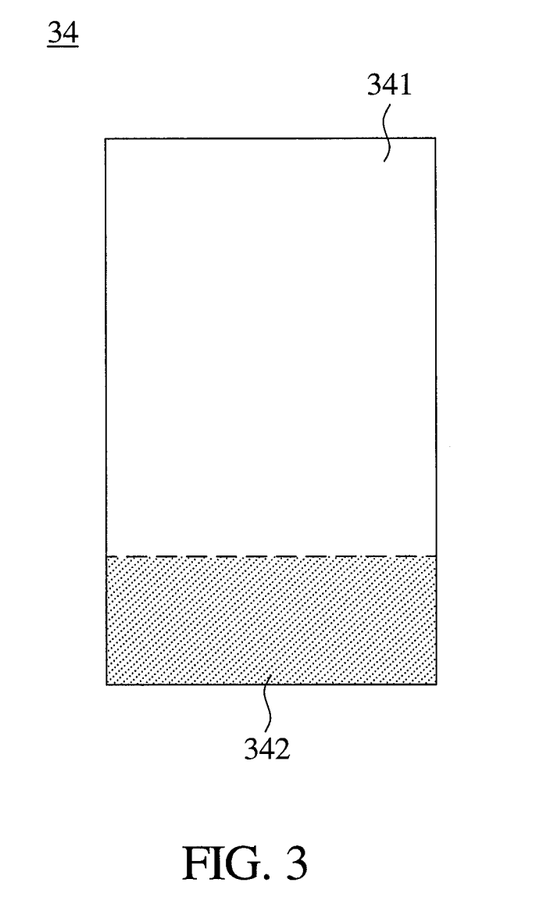
FIG. 3 is a top view of an active layer of Comparative Example 1.

Please refer to FIG. 3, which is a top view of an active layer 34 of Comparative Example 1. A whole structure of Comparative Example 1 is similar to a whole structure of Embodiment 1, i.e., an n-type cladding layer, an n-type waveguide layer, an active layer 34, a p-type waveguide layer, a p-type cladding layer, and a capping layer are formed sequentially on the substrate, where the active layer 34 of Comparative Example 1 includes a light producing portion 341 and a light emitting portion 342. However, Comparative Example 1 differs from Embodiment 1 in that the light emitting portion 342 of the active layer 34 is different from the light emitting portion of the first embodiment. In Comparative Example 1, the whole light emitting portion 342 has a low refractive index.

Figure 4A:
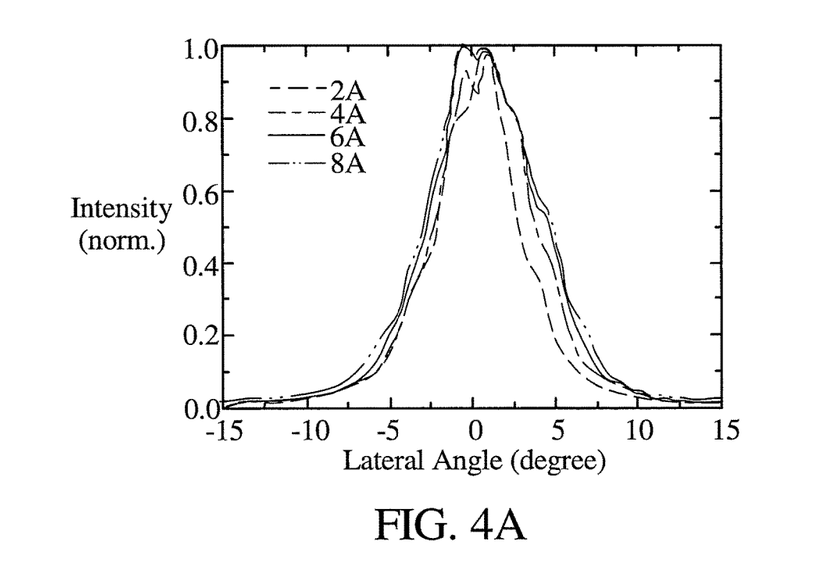
FIG. 4A is a far-field analysis diagram of lateral angles and intensities of Embodiment 1 in using different electrical currents.
Figure 4B:
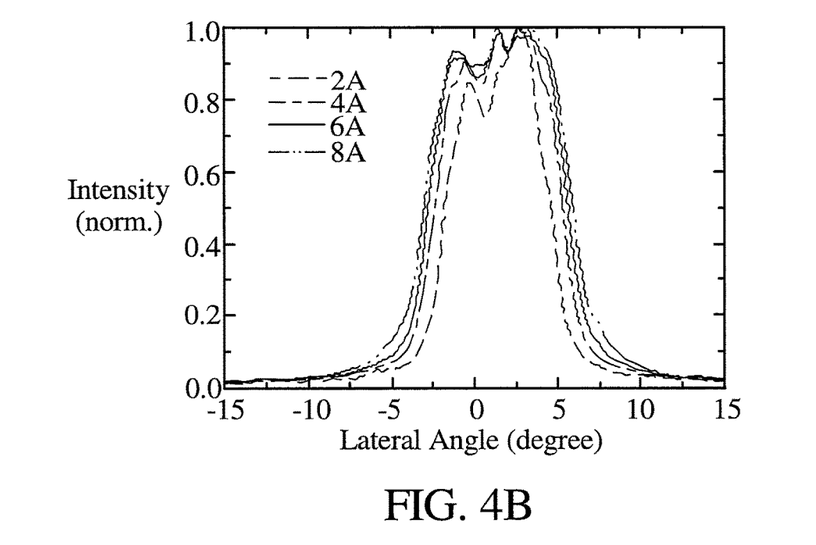
FIG. 4B is a far-field analysis diagram of lateral angles and intensities of Comparative Example 1 in using different electrical currents.
Figure 4C:
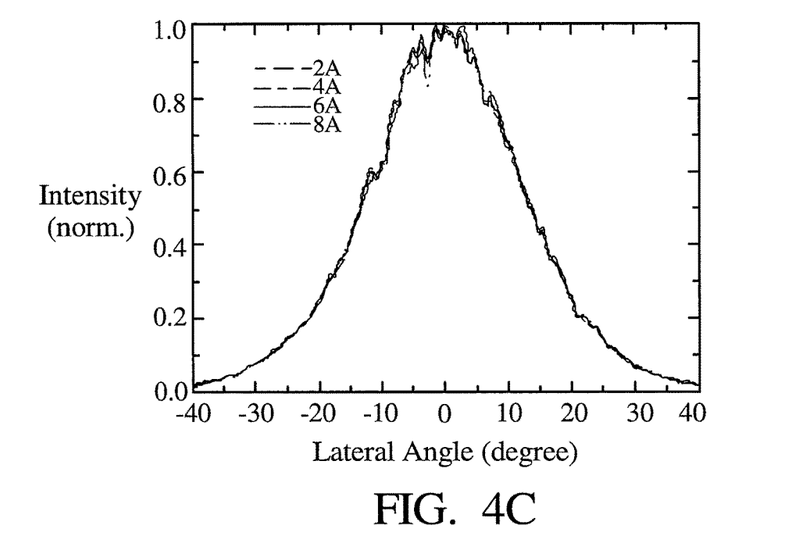
FIG. 4C is a far-field analysis diagram of vertical angles and intensities of Embodiment 1 in using different electrical currents.
Figure 4D:
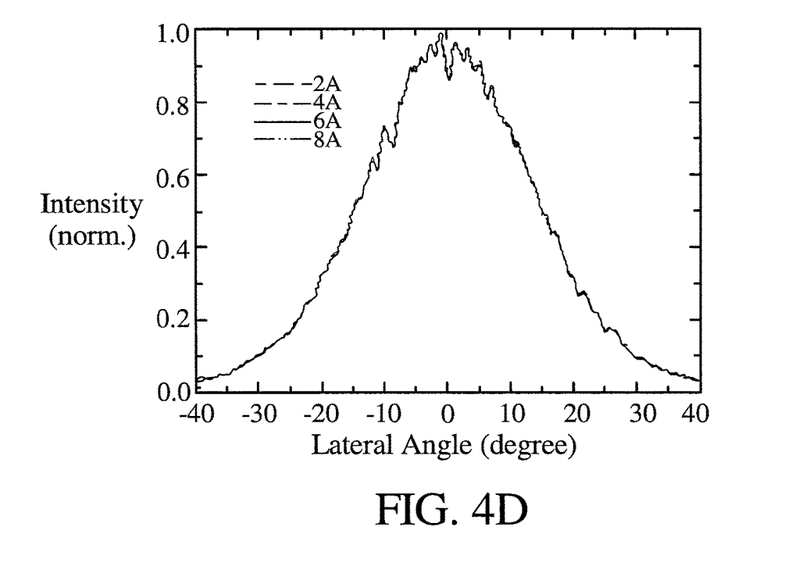
FIG. 4D is a far-field analysis diagram of vertical angles and intensities of Comparative Example 1 in using different electrical currents.
Figure 4E:
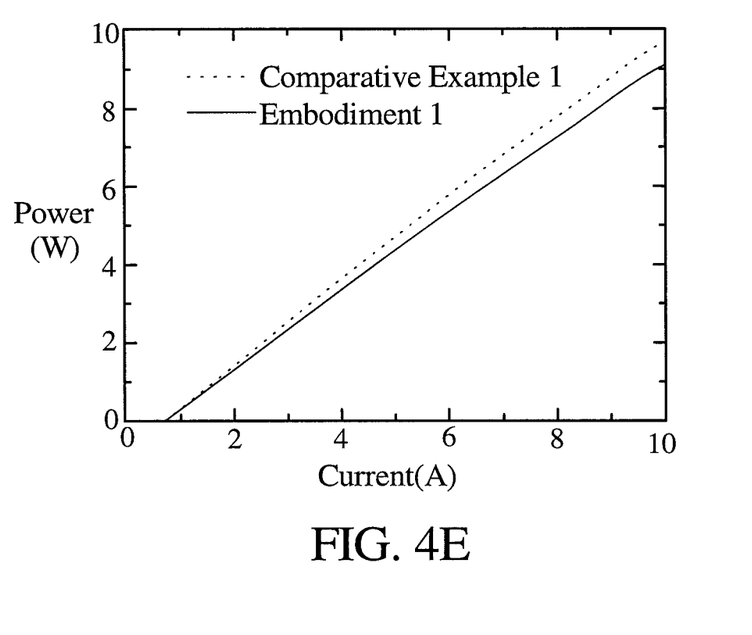
FIG. 4E is an analysis diagram of electrical currents in relation to optical powers of Embodiment 1 and Comparative Example 1.

Then an analysis and comparison step is performed on the semiconductor laser apparatuses of Embodiment 1 and Comparative Example 1 by a measuring machine so as to obtain the analysis result as shown in FIGS. 4A to 4E, where FIG. 4A is a far-field analysis diagram of lateral angles and intensities of Embodiment 1 in using different electrical currents; FIG. 4B is a far-field analysis diagram of lateral angles and intensities of Comparative Example 1 in using different electrical currents; FIG. 4C is a far-field analysis diagram of vertical angles and intensities of Embodiment 1 in using different electrical currents; FIG. 4D is a far-field analysis diagram of vertical angles and intensities of Comparative Example 1 in using different electrical currents; and FIG. 4E is an analysis diagram of electrical currents in relation to optical powers of Embodiment 1 and Comparative Example 1.

From the analysis result in FIGS. 4A and 4B, in the case where the electrical current is 2, 4, 6, and 8 A respectively, full width at half maximum values of lateral angles of Embodiment 1 are 4.8 degrees, 6.0 degrees, 7.2 degrees, and 7.6 degrees. In the case where the electrical current is 2, 4, 6, and 8 A respectively, full width at half maximum values of lateral angles of Comparative Example 1 are 6.4 degrees, 7.8 degrees, 8.4 degrees, and 9.0 degrees. Since the full width at half maximum values of the lateral angle of Embodiment 1 is less than the full width at half maximum values of Comparative Example 1 at the same electrical current, Embodiment 1 indeed reduces the far-filed lateral beam divergence angle.

From the analysis result in FIGS. 4C and 4D, in the case where the electrical current is 2, 4, 6, and 8 A respectively, full width at half maximum values of vertical angles of Embodiment 1 are 26.8 degrees, 27.0 degrees, 27.4 degrees, and 26.8 degrees. In the case where the electrical current is 2, 4, 6, and 8 A respectively, full width at half maximum values of vertical angles of Comparative Example 1 are 29.8 degrees, 29.6 degrees, 30.0 degrees, and 30.2 degrees. Since the full width at half maximum values of the vertical angle of Embodiment 1 is less than the full width at half maximum values of Comparative Example 1 at the same electrical current, Embodiment 1 indeed reduces the far-filed vertical beam divergence angle. From the analysis result in FIG. 4E, Embodiment 1 the same critical current as Comparative Example 1, which demonstrates that Embodiment 1 of the present disclosure does not cause much more loss than Comparative Example 1. Further, although an optical power of Embodiment 1 was slightly less than an optical power of Comparative Example 1 under the same electrical current, the semiconductor laser apparatus 10 of the Embodiment 1 can have a relatively good coupling efficiency during coupled to an optical fiber, due to a small far-field beam angle of Embodiment 1.

As described above, the semiconductor laser apparatus 10 of one embodiment of the present disclosure, by an active layer with a special design or a special structure, may decrease a far-field lateral beam divergence angle and a far-field vertical beam divergence angle of an emitted laser, and does not substantially affect light output efficiency.

The present disclosure has been described with a preferred embodiment thereof and it is understood that many changes and modifications to the described embodiment can be carried out without departing from the scope and the spirit of the disclosure that is intended to be limited only by the appended claims.

What is claimed is:

1. A semiconductor laser apparatus, comprising:
   a substrate;
   a first type cladding layer disposed on the substrate;
   a first type waveguide layer disposed on the first type cladding layer;
   an active layer disposed on the first type waveguide layer and comprising a light producing portion and a light emitting portion, wherein a laser produced by the light producing portion, emits along a direction from the light producing portion toward the light emitting portion;
   the light emitting portion comprises a first inactive region, a light emitting region and a second inactive region, wherein a refractive index of the light emitting region is lower than a refractive index of the first inactive region, the refractive index of the light emitting region is lower than a refractive index of the second inactive region, and width of a first part of the light emitting region continuously increases along the direction from the light producing portion toward the light emitting portion;

a second type waveguide layer disposed on the active layer;

a second type cladding layer disposed on the second type waveguide layer; and a capping layer disposed on the second type cladding layer.

2. The semiconductor laser apparatus according to claim 1, wherein the first type cladding layer is an n-type cladding layer; the first type waveguide layer is an n-type waveguide layer; the second type waveguide layer is a p-type waveguide layer; and the second type cladding layer is a p-type cladding layer.

3. The semiconductor laser apparatus according to claim 1, wherein the first type cladding layer is a p-type cladding layer; the first type waveguide layer is a p-type waveguide layer; the second type waveguide layer is an n-type waveguide layer; and the second type cladding layer is an n-type cladding layer.

4. The semiconductor laser apparatus according to claim 1, wherein a second part of the light emitting region has a constant width along the direction from the light producing portion toward the light emitting portion.

5. The semiconductor laser apparatus according to claim 1, further comprising:

a first boundary located between the first inactive region and the light emitting region; and a second boundary located between the light emitting region and the second inactive region, wherein the width of the first part of the light emitting region is defined by a distance between the first boundary and the second boundary.

6. The semiconductor laser apparatus according to claim 5, wherein the first boundary is linear or parabolic in shape.

7. The semiconductor laser apparatus according to claim 6, wherein the second boundary is linear or parabolic in shape.

8. The semiconductor laser apparatus according to claim 1, wherein the light producing portion comprises:

a first inactive light producing region;

a second inactive light producing region; and a light producing region disposed between the first inactive light producing region and the second inactive light producing region, wherein a refractive index of the light producing region is greater than a refractive index of the first inactive light producing region, and the refractive index of the light producing region is greater than a refractive index of the second inactive light producing region.

9. The semiconductor laser apparatus according to claim 8, further comprising:

a first border located between the first inactive light producing region and the first inactive region; and a first boundary located between the first inactive region and the light emitting region, wherein a first angle, ranging from 0.1 degrees to 89.9 degrees, is located between the first boundary and the first border.

10. The semiconductor laser apparatus according to claim 9, further comprising:

a second border located between the second inactive light producing region and the second inactive region; and a second boundary located between the second inactive region and the light emitting region, wherein a second angle, ranging from 0.1 degrees to 89.9 degrees, is located between the second boundary and the second border.

* * * * *